(12) United States Patent
Illing et al.

(10) Patent No.: US 10,998,898 B2
(45) Date of Patent: May 4, 2021

(54) METHOD FOR OPERATING A TRANSISTOR DEVICE AND ELECTRONIC CIRCUIT WITH A TRANSISTOR DEVICE (71) Applicant: Infineon Technologies AG, Neubiberg (DE)

(72) Inventors: Robert Illing, Finkenstein (AT); Christian Djelassi-Tscheck, Villach (AT); Alexander Mayer, Treffen (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 204 days.

(21) Appl. No.: 16/227,894

(22) Filed: Dec. 20, 2018

(65) Prior Publication Data
US 2019/0199342 A1 Jun. 27, 2019

(30) Foreign Application Priority Data
Dec. 22, 2017 (DE) .......................... 102017131225.0

(51) Int. Cl.
*H03K 17/08* (2006.01)
*H03K 17/082* (2006.01)
*H03K 17/0812* (2006.01)

(52) U.S. Cl.
CPC ... *H03K 17/0822* (2013.01); *H03K 17/08122* (2013.01); *H03K 2017/0806* (2013.01)

(58) Field of Classification Search
CPC ....... H03K 2017/0806; H03K 17/0822; H03K 17/08; H02H 3/06
See application file for complete search history.

(56) References Cited

U.S. PATENT DOCUMENTS

| 2013/0069612 | A1  |  3/2013 | Feldtkeller |
| 2015/0280416 | A1* | 10/2015 | Kreuter .............. H03K 17/0826 361/55 |
| 2017/0149233 | A1* |  5/2017 | Hanson .......... H03K 19/017509 |

FOREIGN PATENT DOCUMENTS

| DE | 102007041784 A1 | 3/2009 |
| DE | 102012216558 A1 | 3/2013 |

* cited by examiner

*Primary Examiner* — Rafael O De Leon Domenech
(74) *Attorney, Agent, or Firm* — Slater Matsil, LLP (57) ABSTRACT

A method includes monitoring a load path voltage and an operating parameter of the transistor device; operating the transistor device in a normal mode when the operating parameter is below a threshold associated with the operating parameter, where operating the transistor device in the normal mode includes operating the transistor device in one of an on-state or an off-state based on a drive signal; and operating the transistor device in a fault mode upon detecting a fault based on comparing the operating parameter with the threshold. Operating the transistor device in the fault mode includes switching off the transistor device, operating the transistor device in the on-state includes adjusting the threshold in accordance with a first characteristic curve dependent on the load path voltage, and operating the transistor device in the off-state includes adjusting the threshold according to a second characteristic curve different from the first characteristic curve.

22 Claims, 8 Drawing Sheets

METHOD FOR OPERATING A TRANSISTOR DEVICE AND ELECTRONIC CIRCUIT WITH A TRANSISTOR DEVICE

This application claims the benefit of German Application No. 102017131225.0, filed on Dec. 22, 2017, which application is hereby incorporated herein by reference in its entirety.

TECHNICAL FIELD

This disclosure in general relates to a method for operating a transistor device and an electronic circuit including a transistor device.

BACKGROUND

Transistor devices such as MOSFETs (Metal Oxide Semiconductor Field-Effect Transistors) are widely used as electronic switches in various types of applications such as, for example, power conversion, automotive, motor drive, household or consumer electronic applications. A conventional drive circuit for driving a transistor device includes a signal input for receiving a drive signal and is configured to switch on or off the transistor device based on the drive signal. Further, the drive circuit may monitor at least one operation parameter and switch off the transistor device, independent of the drive signal, based on the operating parameter in order to protect the transistor device from being overloaded. The operating parameter may include a current through the transistor device or a temperature of the transistor device.

There is a need for an improved method of operating a transistor device and an electronic circuit with a transistor device and a drive circuit.

SUMMARY

One example relates to a method. The method includes monitoring a load path voltage and an operating parameter of a transistor device, operating the transistor device in a normal mode when the operating parameter is below a threshold associated with the operating parameter, wherein operating the transistor device in the normal mode comprises operating the transistor device in one of an on-state or an off-state based on a drive signal. The method further includes operating the transistor device in a fault mode upon detecting a fault based on comparing the operating parameter with a threshold associated with the operating parameter, wherein operating the transistor device in the fault mode comprises switching off the transistor device. Operating the transistor device in the on-state comprises adjusting the threshold in accordance with a first characteristic curve that is dependent on the load path voltage, and operating the transistor device in the off-state comprises adjusting the threshold in accordance with a second characteristic curve different from the first characteristic curve.

Another example relates to an electronic circuit that includes a drive circuit. The drive circuit is configured to monitor load path voltage and an operating parameter of a transistor device, operate the transistor device in a normal mode when the operating parameter is below a threshold associated with the operating parameter, wherein operating the transistor device in the normal mode comprises operating the transistor device in one of an on-state or an off-state based on a drive signal. The drive circuit is further configured to operate the transistor device in a fault mode upon detecting a fault based on comparing the operating parameter with a threshold associated with the operating parameter, wherein operating the transistor device in the fault mode comprises switching off the transistor device. Further, the drive circuit is configured, in the on-state of the transistor device, to adjust the threshold in accordance with a first characteristic curve that is dependent on the load path voltage, and, in the off-state of the transistor device, to adjust the threshold in accordance with a second characteristic curve different from the first characteristic curve.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
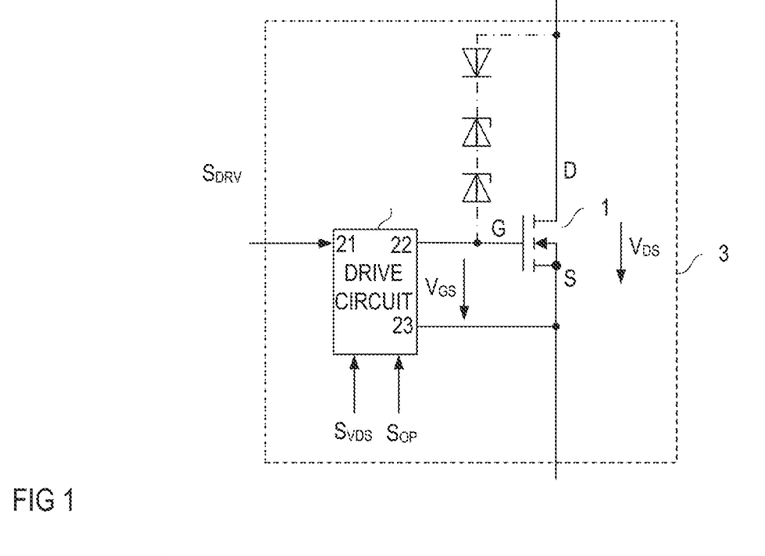
FIG. 1 illustrates an electronic circuit with a transistor device and a drive circuit configured to drive the transistor device.

FIG. 1 shows one example of an electronic circuit that includes a transistor device 1 and a drive circuit 2. The drive circuit 2 is configured to drive the transistor device 1 based on a drive signal $S_{DRV}$, a load path voltage $V_{DS}$ of the transistor device 1, and an operating parameter OP. In FIG. 1, signal $S_{VDS}$ received by the drive circuit 2 represents the load path voltage $V_{DS}$. This signal $S_{VDS}$ is also referred to as load path voltage signal in the following. Further, signal $S_{OP}$ received by the drive circuit 2 represents the operating parameter OP. This signal $S_{OP}$ is also referred to as operating parameter signal in the following. The transistor device 1 includes a drive input between a control node G and a first load node S and the load path between a second load node D and the first load node S. The transistor device 1 switches on or off dependent on a drive voltage $V_{GS}$ received at the drive input G, S.

The transistor device 1 and the drive circuit 2 may be implemented as one integrated circuit in an integrated circuit package 3 (schematically illustrated in dashed lines in FIG. 1). The integrated circuit may include one semiconductor body (die) in which both the transistor device 1 and the drive circuit 2 are integrated, or two semiconductor bodies, a first one in which the transistor device 1 is integrated and a second one in which the drive circuit 2 is integrated. These two semiconductor bodies may be arranged in a chip-on-chip or a chip-by-chip configuration inside the package 3.

According to one example, the transistor device 1 is a MOSFET (Metal Oxide Semiconductor Field-Effect Transistor). It should be noted that the term MOSFET as used herein denotes any type of field-effect transistor with an insulated gate electrode (often referred to as IGFET) independent of whether the gate electrode includes a metal or another type of electrically conducting material, and independent of whether the gate dielectric includes an oxide or another type of dielectrically insulating material. The circuit symbol of the transistor device 1 shown in FIG. 1 represents an n-type enhancement MOSFET. However, this is just for illustration purposes. Any other type of MOSFET such as a p-type enhancement or depletion MOSFET or an n-type depletion MOSFET, or any other type of field-effect transistor such as an IGBT (Insulated Gate Bipolar Transistor) or a JFET (Junction Field-Effect Transistor) may be used as well.

In a MOSFET, the control node G is also referred to as gate node, the first load node S is also referred to as source node, the second load node D is also referred to as drain node, and the drive voltage $V_{GS}$ is also referred to as gate-source voltage. Although the transistor device 1 shown in FIG. 1 is not restricted to be implemented as a MOSFET, the terms gate node G, source node S and drain node D will be used in the following to denote the control node, the first load node and the second load node, respectively.

Referring to FIG. 1, the drive circuit 2 generates the drive voltage $V_{GS}$ at an output node 22, 23 connected to the drive input G, S of the transistor device 1. More specifically, the output of the drive circuit 2 includes a first output node 22 coupled to the gate node G and a second output node 23 coupled to the source node S. The drive signal $S_{DRV}$ is received at an input 21 of the drive circuit 2. The drive signal $S_{DRV}$ may be any type of signal suitable for conveying switching information, wherein the switching information defines whether it is desired to switch on or switch off the transistor device 1. According to one example, the drive signal $S_{DRV}$ has one of two different signal levels, an on-level indicating that the transistor device 1 is to be switched on, or an off-level indicating that the transistor device 1 is to be switched off.

Figure 2A:
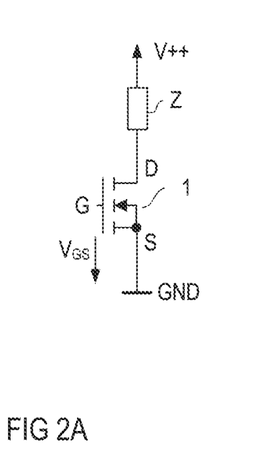
FIGS. 2A to 2C show different examples of how the electronic circuit with the transistor device may be used as an electronic switch.
Figure 2B:
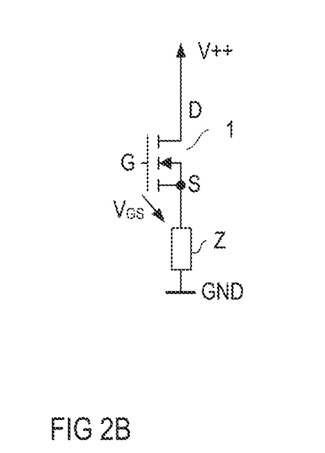
Figure 2C:
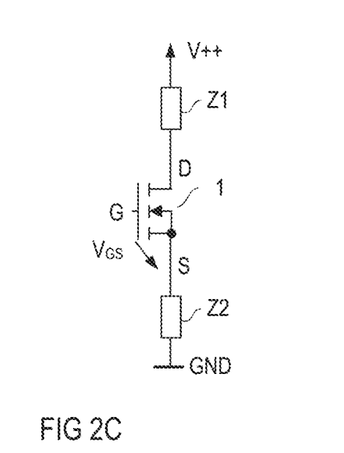

The electronic circuit with the transistor device 1 and the drive circuit 2 may be used as an electronic switch in various types of electronic circuits. Some examples of how the electronic circuit may be used as an electronic switch are illustrated in FIGS. 2A to 2C. For the ease of illustration only the transistor device 1 is shown and the drive circuit 2 is omitted in these figures. Referring to FIG. 2A, the electronic circuit may be used as a low-side switch. In this case, the load path D-S of the transistor device 1 is connected between a load Z and a circuit node where a negative supply potential or ground potential GND is available, wherein a series circuit with the load path D-S of the transistor device 1 and the load Z is connected between a circuit node for a positive supply potential V++ and the circuit node for the negative supply potential or ground GND. Referring to FIG. 2B, the electronic circuit may be used as a high-side switch. In this example, the load path D-S of the transistor device 1 is connected between the circuit node for the positive supply potential V++ and the load Z. According to another example shown in FIG. 2C, the load path D-S is connected between two loads Z1, Z2, wherein a series circuit that includes the loads Z1, Z2 and the load path D-S is connected between circuit nodes for the positive supply potential V++ and the negative supply potential or ground GND.

Figure 3:
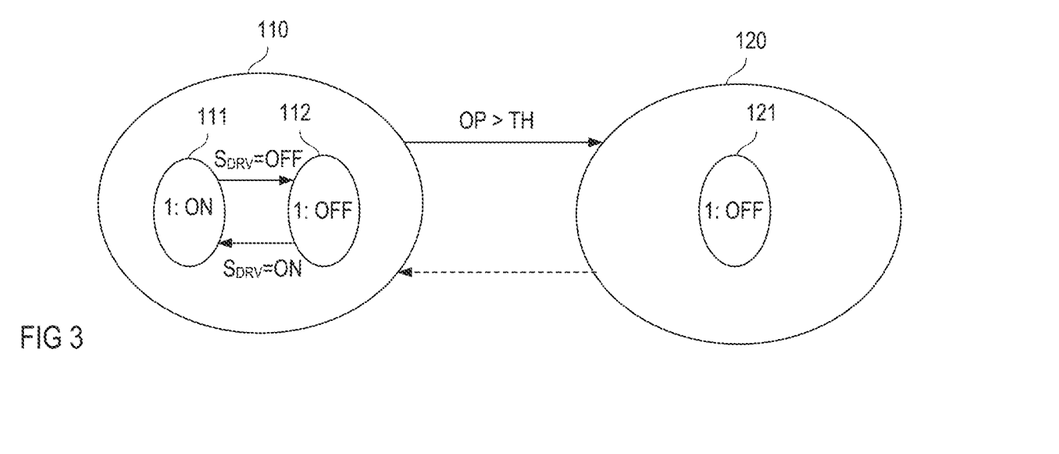
FIG. 3 shows a state diagram that illustrates one example of a method for operating the transistor device based on a drive signal, an operating parameter, and a threshold associated with the operating parameter.

FIG. 3 shows a state diagram that illustrates one example of a method for operating the transistor device 1 by the drive circuit 2. Referring to FIG. 3, operating the transistor device 1 includes operating the transistor device 1 in one of two different operation modes, a first mode no, which is also referred to as normal mode in the following, and a second mode 120, which is also referred to as fault mode in the following. Whether the transistor device 1 is operated in the normal mode no or the fault mode 120 is dependent on a result of comparing an operating parameter OP with a predefined threshold TH. Examples of the operating parameter OP and examples for determining the threshold TH are explained in detail herein further below.

Referring to FIG. 3, operating the transistor device 1 in the normal mode no includes operating the transistor device 1 in one of an on-state in and an off-state 112 based on the drive signal $S_{DRV}$. More specifically, operating the transistor device 1 based on the drive signal $S_{DRV}$ may include operating the transistor device 1 in the on-state in when the drive signal $S_{DRV}$ has the on-level, and operating the transistor device 1 in the off-state when the drive signal $S_{DRV}$ has the off-level.

Figure 4A:
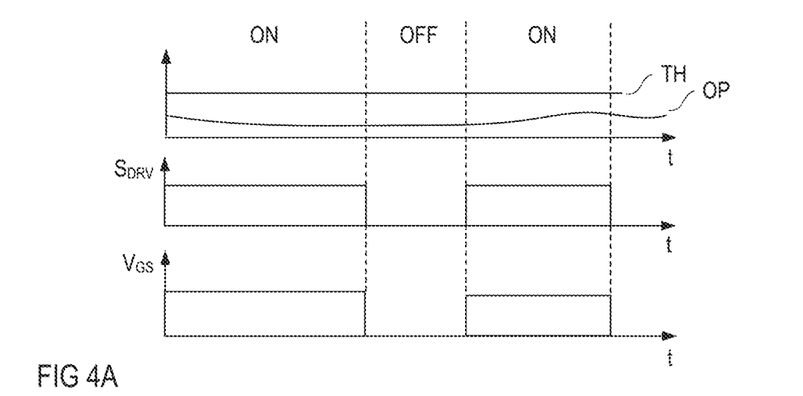
FIGS. 4A and 4B show signal diagrams that illustrate operating the transistor device in a normal mode and a fault mode.

Operating the transistor device 1 in the normal mode no based on the drive signal $S_{DRV}$ is illustrated in FIG. 4A. FIG. 4A shows signal diagrams of the drive signal $S_{DRV}$, the drive voltage $V_{GS}$, the operating parameter OP and the threshold TH in the normal mode. In this operating mode, the drive voltage $V_{GS}$ is generated such that the drive voltage $V_{GS}$ switches on the transistor device 1 whenever the drive signal $S_{DRV}$ has the on-level and switches off the transistor device 1 whenever the drive signal $S_{DRV}$ has the off-level. Just for the purpose of illustration, in FIG. 4A, the on-level of the drive signal $S_{DRV}$ is a high signal level, while the off-level is a low signal level. It should be noted that the drive signal $S_{DRV}$ and the drive voltage $V_{GS}$ are only schematically illustrated in FIG. 4A so that, for example, inevitable delay times (propagation delays) between falling and rising edges of the drive signal $S_{DRV}$ and corresponding edges of the drive voltage $V_{GS}$ are not illustrated.

Referring to FIG. 3, the operating mode of the transistor device 1 changes from the normal mode 110 to the fault mode 120 based on comparing the operating parameter OP with the threshold TH. This transfer of the operating mode based on comparing the operating parameter OP with the threshold TH may include changing the operating mode from the normal mode 110 to the fault mode 120 when the operating parameter OP reaches or rises to above the threshold TH. Operating the transistor device 1 in the fault mode may include switching off the transistor device 1 so that the transistor device 1 is in an off-state 121, which is referred to as further off-state 121 in the following.

It should be noted that "comparing the operating parameter OP with the threshold TH" may include comparing more than one operating parameter with a respective threshold. In this case, the operating mode changes from the normal mode 110 to the fault mode 120 when at least one of these comparisons reveals that a fault has occurred. "Revealing that a fault has occurred" may include that an operating parameter rises to above the respective (associated) threshold.

Figure 4B:
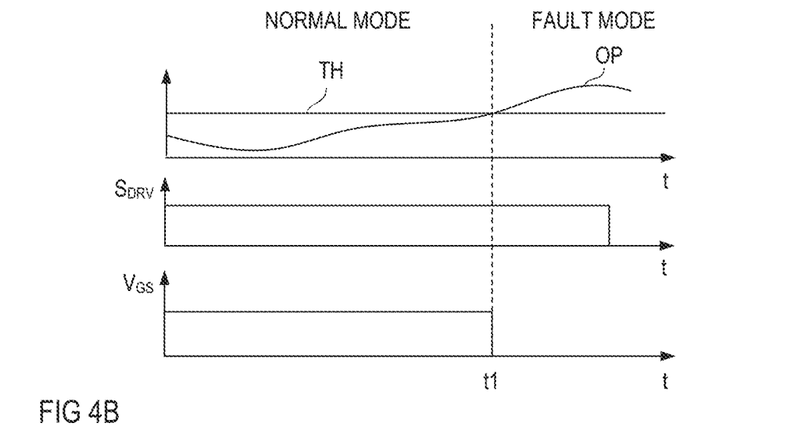

One example of a transfer of the operating mode from the normal mode 110 to the fault mode 120 is illustrated in FIG. 4B. FIG. 4B shows signal diagrams of the drive signal $S_{DRV}$, the drive voltage $V_{GS}$, the operating parameter OP and the threshold TH according to one example. In this example, the operating parameter OP reaches the threshold TH at a time instance ti. At this time instance ti, the drive voltage $V_{GS}$ changes to a voltage level that switches off the transistor device 1 although the drive signal $S_{DRV}$ remains on the on-level. Time instance ti is the time instance when the operating mode changes from the normal mode 110 to the fault mode 120.

The operating parameter OP is a parameter that is suitable to detect a load condition of the transistor device 1 and that is suitable detect when there is the risk that the transistor device 1 is overloaded and might be damaged or destroyed when further operated under this load condition. Some examples of operating parameters suitable to detect a load condition of the transistor device 1 are explained in the following.

Figure 5:
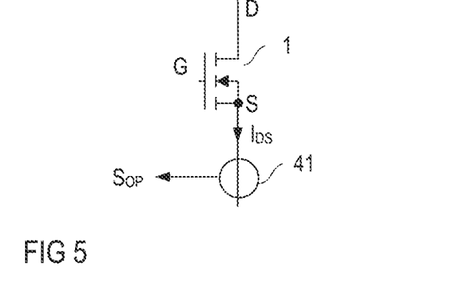
FIG. 5 illustrates a current sensor configured to measure a load current, which represents one example of an operating parameter.

Referring to FIG. 5, a load current $I_{DS}$ through the transistor device 1 may be used as the operating parameter OP. This load current $I_{DS}$ may be measured using any kind of current sensor 41 that is suitable to measure the load current $I_{DS}$ and output the operating parameter signal $S_{OP}$ that represents the load current $I_{DS}$.

Figure 6:
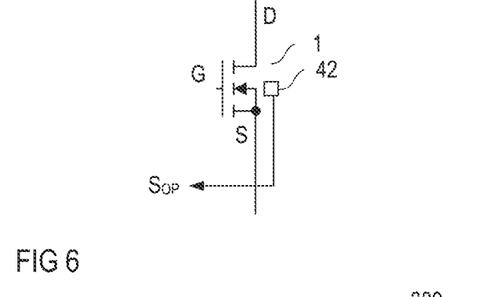
FIG. 6 illustrates a temperature sensor configured to measure a temperature of the transistor device, which represents one example of an operating parameter.

According to another example shown in FIG. 6, the operating parameter is a temperature of the transistor device 1. The temperature may be measured using any kind of temperature sensor 42 that is suitable to measure the temperature of the transistor device 1. An operating parameter signal $S_{OP}$ output by the temperature sensor 42 represents the temperature of the transistor device 1.

Figure 7:
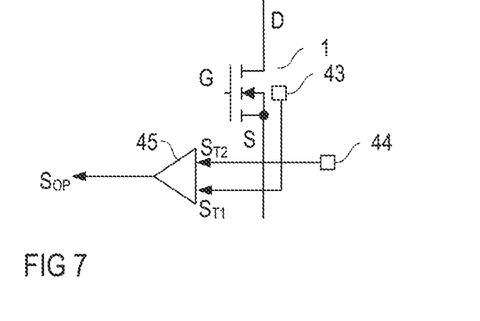
FIG. 7 illustrates a temperature difference sensor configured to measure a temperature difference, which represents another example of an operating parameter.

According to another example shown in FIG. 7, the operating parameter OP is a temperature difference between a first temperature T1 measured at a first position of the transistor device 1 and a second temperature T2 measured at a second position, wherein the second position is spaced apart from the first position. Referring to FIG. 7, the first temperature T1 at the first position may be measured using a first temperature sensor 43 and the second temperature T2 at the second position may be measured using a second temperature sensor 44. The first temperature sensor 43 outputs a first temperature signal $S_{T1}$ that represents the first temperature, and the second temperature sensor 44 outputs a second temperature signal $S_{T2}$ that represents the second temperature. A calculation unit 45 calculates the difference between the first and second temperature signal $S_{T1}$, $S_{T2}$ and operates the operating parameter signal $S_{OP}$ representing the temperature difference.

Figure 8:
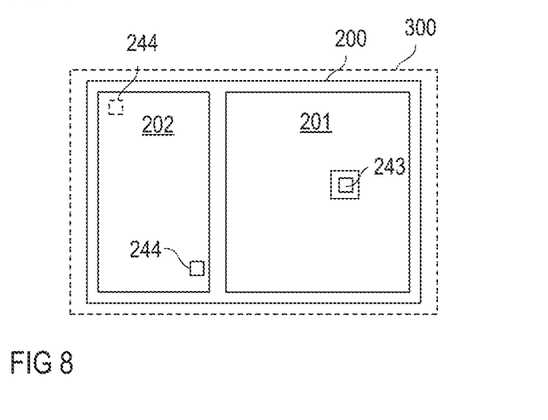
FIG. 8 shows a top view of a semiconductor arrangement and illustrates positions where temperatures may be measured by the temperature difference sensor.

FIG. 8 schematically illustrates one example where the first and second positions of the first and second temperature sensors 43, 44 may be located. FIG. 8 illustrates a top view of a semiconductor body 100 in which both the transistor device 1 and the drive circuit 2 are integrated. In this example, the transistor device 1 is integrated in a first region 201 of the semiconductor body 200 and the drive 2 is integrated in a second region 202 of the semiconductor body 200. In the example shown in FIG. 8, the first temperature T1 is measured at a first position 243 that is inside the first region 201. A second position 244 where the second temperature is measured is spaced apart from the first region 201, that is, spaced apart from the transistor device 1. Two different examples of where the second position 244 may be located are illustrated in FIG. 8. One possible location of the second position is illustrated in solid lines in FIG. 8 and another possible location is illustrated in dashed lines in FIG. 8. It goes without saying that there are various other possible locations for the second position 244.

Referring to the above, the transistor device 1 and the drive circuit 2 may be integrated in two different semiconductor bodies inside the same package 300. In this case, the first position may be a position on one of the semiconductor bodies and the second position may be a position on the other one of the semiconductor bodies.

When the transistor device is in the normal mode no and the on-state 111, additionally to the operating parameter OP, the load path voltage $V_{DS}$ is considered in the decision of whether or not changing the operating mode from the normal mode no to the fault mode 120. This is achieved in that the threshold TH is dependent on the load path voltage $V_{DS}$.

Figure 9A:
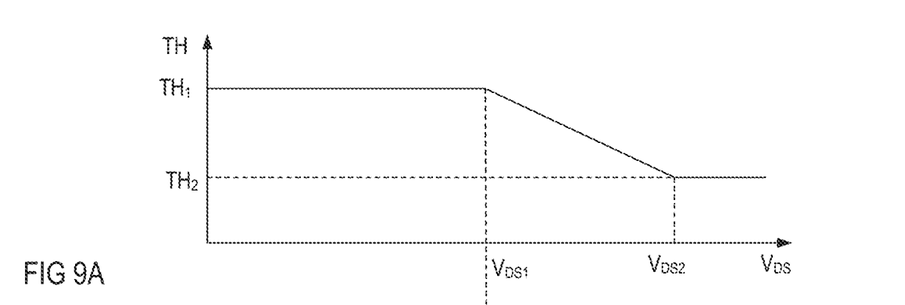
FIGS. 9A to 9D illustrate examples of a first characteristic curve and second characteristic curves of the threshold.

FIG. 9A shows one example of a first characteristic curve that illustrates a relationship between the threshold TH and the load path voltage $V_{DS}$. In this example, there is a voltage range (voltage interval) of the drive voltage $V_{DS}$ where the threshold TH decreases as the drive voltage $V_{DS}$ increases. In the example shown in FIG. 9A, this voltage range ranges from a first voltage level $V_{DS1}$ to a second voltage level $V_{DS2}$. In this example, the threshold TH essentially decreases linearly as the drive voltage $V_{DS}$ increases. This, however, is only an example. It is also possible that the threshold TH decreases non-linearly. For voltage levels of the load path voltage $V_{DS}$ below the second level $V_{DS2}$ the threshold TH is essentially constant in this example.

Generating the threshold based on a first characteristic curve of the type shown in FIG. 9A makes use of the fact that, in the on-state in of the transistor device 1, the load path voltage $V_{DS}$, besides the operating parameter OP, is another parameter that is suitable to monitor the load condition of the transistor device 1. By decreasing the threshold TH when the load path voltage $V_{DS}$ reaches a predefined voltage threshold ($V_{DS1}$ in FIG. 9A) a protection of the transistor device 1 can be improved.

Monitoring the load condition of the transistor device 1 by comparing the operating parameter OP with the threshold TH is also active, when the transistor device 1 is in the off-state 112. That is, a change of the operating mode from the normal mode no to the fault mode 120 may also occur when the transistor device 1 is in the off-state 112. An overload condition as detected by comparing the operating parameter OP with the threshold TH may also occur when the transistor device 1 is in the off-state or changes from the on-state to the off-state. This is because a current may also be driven through the load path of the transistor device 1 when the transistor device 1 is in the off-state 112. An inductive load connected in series with the load path of the transistor device 1 and operated in a PWM (pulse width modulated) fashion by the transistor device 1, for example, may drive a current through the transistor device 1 when the transistor device 1 has changed from the on-state to the off-state until energy stored in the inductive load has been dissipated. In this case, the load causes the load path voltage $V_{DS}$ of the transistor device 1 to increase until an avalanche breakdown occurs and a current flow through the load path. Alternatively, there may be a clamping circuit that switches on the transistor device 1 when the load path voltage $V_{DS}$ rises to above a predefined voltage threshold (which is higher than the supply voltage) and allows the current to flow until energy stored in the inductive load has been dissipated. Such clamping circuit includes, for example, at least one Zener diode and a bipolar diode coupled between the drain node D and the gate node G in a back-to-back configuration. One example of such clamping circuit is illustrated in dashed-and-dotted lines in FIG. 1. Just for the purpose of illustration the clamping circuit shown in FIG. 1 includes two Zener diodes. The actual number of Zener diodes is dependent on the desired voltage threshold of the clamping circuit.

Although the transistor device 1 is already in the off-state 112 and cannot be protected by switching off, it is desirable to detect overload conditions also during the off-state 112 and cause the transistor device 1 to enter the fault mode 120 when such overload condition is detected. During the off-state, however, the load path voltage $V_{DS}$ in many applications inevitably increases to voltage levels higher than the first voltage level $V_{DS1}$ where the threshold TH according to the first characteristic curve shown in FIG. 9A starts to decrease. Thus, decreasing the threshold TH in accordance with a characteristic curve of the type shown in FIG. 9A during the off-state 112 may result in undesired transitions of the operating mode from the normal mode no to the fault mode 120.

Figure 9B:
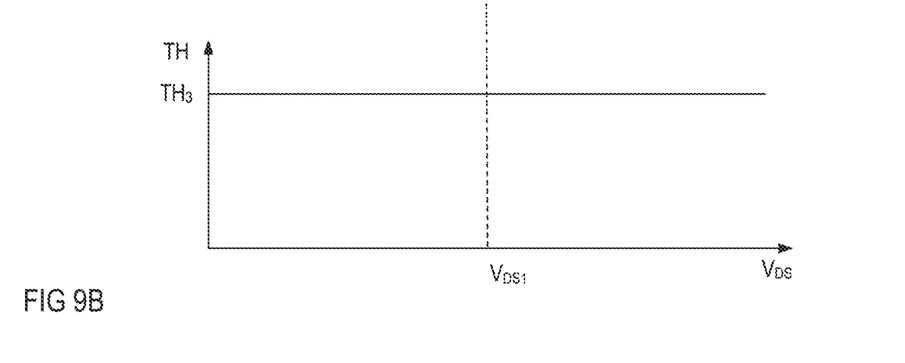

In order to prevent such undesired transitions of the operating mode, in the off-state 112 the threshold TH is adjusted in a different way than in the on-state 111. FIG. 9B shows one example of a characteristic curve that may be used to adjust the threshold TH in the off-state 112. In this example, the threshold TH is constant and, therefore, independent of the load path voltage $V_{DS}$. A voltage level $TH_3$ of the threshold TH used in the off-state may be equal to the first voltage level $TH_1$ used in the on-state and explained with reference to FIG. 9A, or may be different from the first voltage level $TH_1$. According to one example, the voltage level $TH_3$ of the threshold TH used in the off-state is higher than the first voltage level $TH_1$ used in the on-state.

Figure 9C:
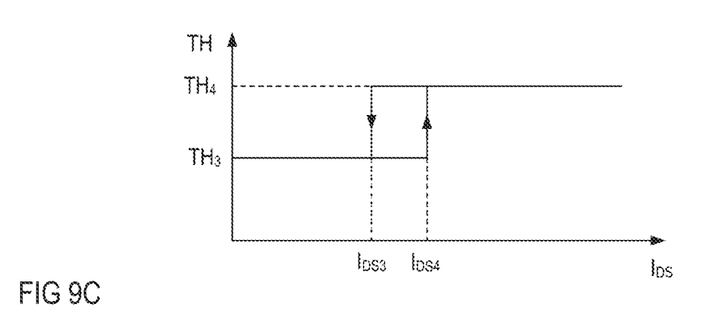
Figure 9D:
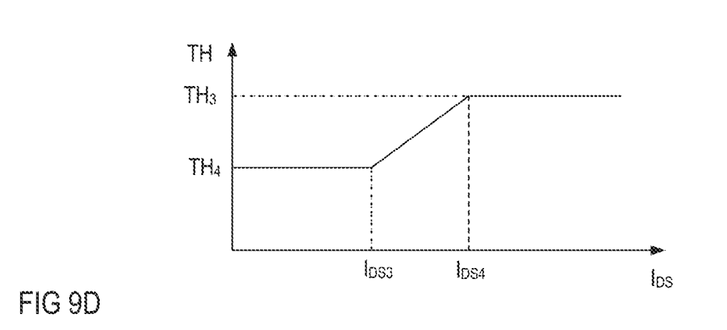

FIGS. 9C and 9D show further example of the second characteristic curve. In these examples, the threshold TH is dependent on the load current $I_{DS}$. That is, the threshold TH has at least two different levels dependent on the load current $I_{DS}$. In the example shown in FIG. 9C, the threshold TH can have two levels, the third level $TH_3$ or a fourth level $TH_4$ higher than the third level $TH_3$. In this example, the threshold TH changes from the third level $TH_3$ to the fourth level $TH_4$ when the load current $I_{DS}$ increases and rises above a first current threshold $I_{DS4}$. The second characteristic curve shown in FIG. 9C includes a hysteresis such that the threshold changes from the second level $TH_4$ back to the first level $TH_3$ when the load current $I_{DS}$ decreases and falls below a second threshold $I_{DS3}$ lower than the first threshold $I_{DS4}$. In the example shown in FIG. 9D, the threshold TH has the first level $TH_3$ when the load current $I_{DS}$ is below the second current threshold $I_{DS3}$, the second level $TH_4$ when the load current $I_{DS}$ is above the first current threshold $I_{DS4}$, and increases as the load current $I_{DS}$ increases between the second and first threshold $I_{DS3}$, $I_{DS4}$. Just for the purpose of illustration, this increase is drawn to be linear in the example shown in FIG. 9D. However, a non-linear increase may be implemented as well.

The characteristic curves shown in FIGS. 9A to 9D are only examples. Other types of different characteristic curves may be used as well.

The transistor device 1 may return from the fault mode 120 to the normal mode 110. Such return to the normal mode no is illustrated in dashed lines in FIG. 3. Unlike the normal mode 110, in which the transistor device 1 switches between the off-state 112 and the on-state 111 dependent on the drive signal $S_{DRV}$, changing the operating mode from the fault mode 120 back to the normal mode no is not only dependent on the drive signal $S_{DRV}$. According to one example, changing the operating mode from the fault mode 120 to the normal mode 110 includes resetting the drive circuit 2. Resetting the drive circuit 2 may include interrupting a supply voltage received by the drive circuit 2. According to another example, changing the operating mode from the fault mode 120 to the normal mode 110 includes obtaining a fault number by counting the detections of a fault condition. "Detecting a fault condition" is equivalent to changing the operating mode from the normal mode 110 to the fault mode 120. In this example, the operating mode may change from the fault mode 120 to the normal mode 110 when the fault number is below a predefined number and when the drive signal $S_{DRV}$ changes from the off-level to the on-level. If the fault number reaches the predefined number, the transistor device 1 may remain in the fault mode 120 until the drive circuit 2 is reset. The predefined number can be 1 (one) or higher than 1.

According to yet another example, changing the operating mode from the fault mode 120 to the normal mode 110 includes waiting for a predefined waiting period. In this case, the operating mode changes from the fault mode 120 to the normal mode 110 after the waiting period. Alternatively, the operating mode may change from the fault mode to the normal mode after the operating parameter has decreased to below a normal mode threshold that is lower than the threshold TH explained herein before. The waiting time can be combined with the threshold decision such that the waiting time starts when the operating parameter falls below the normal mode threshold and the operating mode changes from the fault mode to the normal mode after the waiting time has elapsed.

Figure 10:
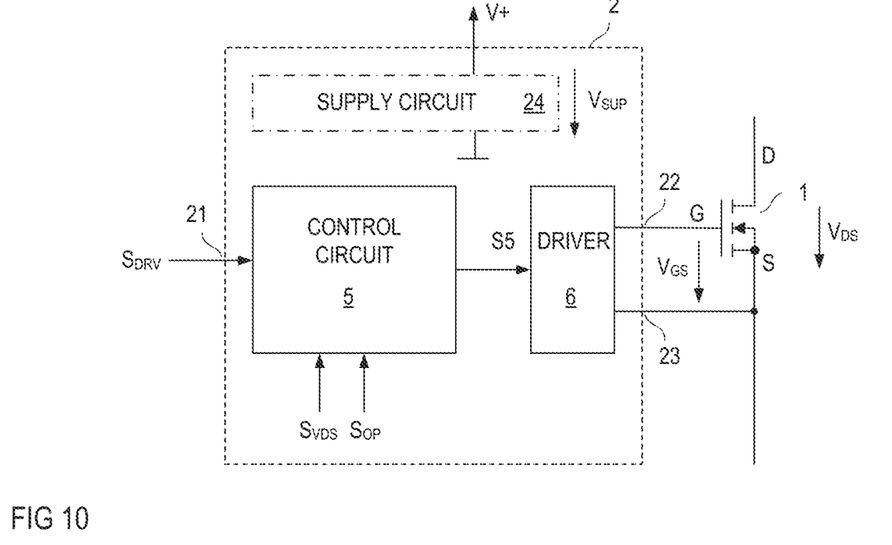
FIG. 10 shows one example of a drive circuit that includes a control circuit and a driver.

FIG. 10 shows one example of the drive circuit 2 in greater detail. In this example, the drive circuit 2 includes a control circuit 5 that receives the drive signal $S_{DRV}$, the load path voltage signal $S_{VDS}$ representing the load path voltage $V_{DS}$, and the operating parameter signal $S_{OP}$ representing the operating parameter OP. The control circuit 5 is configured to process these signals $S_{DRV}$, $S_{VDS}$, $S_{OP}$ and output a control signal S5 to a driver 6. The driver is configured to generate the drive voltage $V_{GS}$ based on the control signal S5. The control signal S5 includes the information on the desired switching state (on-state or off-state) of the transistor device 1. This control signal S5 is generated by the control circuit 5 in accordance with the state diagram shown in FIG. 3. That is, the control circuit 5 generates the control signal S5 such that the driver 6 switches on the transistor device 1 when the transistor device 1 is in the normal mode and the drive signal $S_{DRV}$ indicates that it is desired to switch on the transistor device. Equivalently, the control circuit 5 generates the control signal S5 such that the driver 6 switches off the transistor device 1 either when the transistor device is operating in the normal mode and the drive signal $S_{DRV}$ indicates that it is desired to switch off the transistor device, or when a fault has been detected. In the following, the terms "normal mode" and "fault mode" are also used to describe an operating mode of the drive circuit 2. The drive circuit 2 is in the fault mode when based on the operating parameter $S_{OP}$ a fault has been detected and in the normal mode when no such fault has been detected.

Referring to FIG. 10, the drive circuit 2 may include a supply circuit 24. This supply circuit 24 receives a supply voltage $V_{SUP}$ and is configured to generate internal supply voltages (not shown) received by the control circuit 5 and the driver 6. Resetting the drive circuit 2 as explained herein before may include interrupting the supply voltage $V_{SUP}$ received by the supply circuit 24.

Figure 11:
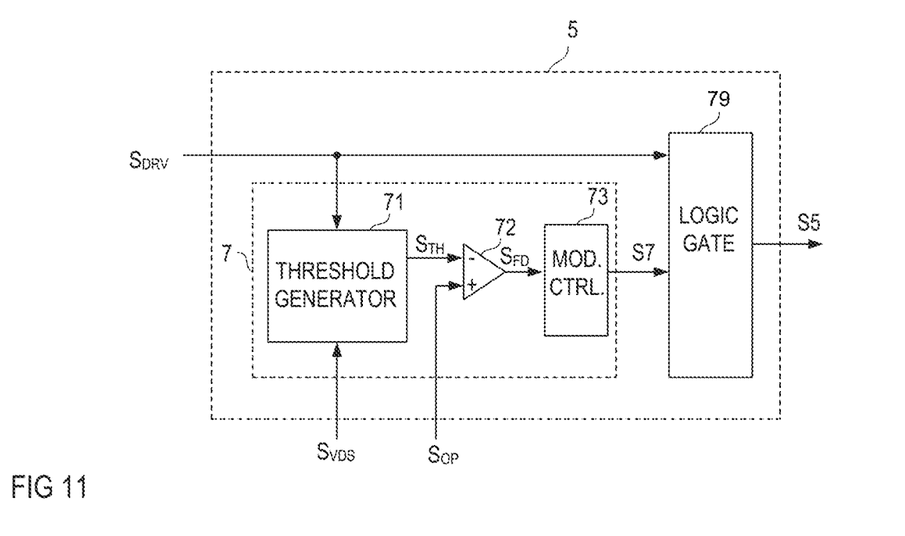
FIG. 11 shows one example of the control circuit in greater detail.

FIG. 11 shows one example of the control circuit 5 in greater detail. FIG. 11 shows a block diagram of the control circuit 5. It should be noted that this block diagram illustrates the functional blocks of the control circuit 5 rather than a specific implementation. Those functional blocks can be implemented in various ways. According to one example, these functional blocks are implemented using dedicated circuitry. According to another example, the control circuit 5 is implemented using hardware and software. The control circuit 5, for example, may include a microcontroller and software running on the microcontroller.

Referring to FIG. 11, the control circuit 5 includes a threshold generator 71 that outputs a threshold signal $S_{TH}$. This threshold signal $S_{TH}$ represents the threshold TH explained herein before. The threshold generator 71 receives the drive signal $S_{DRV}$ and the load path voltage signal $S_{VDS}$. The threshold generator 71 is configured to generate the threshold signal $S_{TH}$ in accordance with the characteristic curves explained with reference to FIGS. 9A and 9B. That is, the threshold generator 71 may generate the threshold signal $S_{TH}$ such that the threshold TH is in accordance with the first characteristic curve shown in FIG. 9A when the transistor device 1 is in the on-state 111 and such that the threshold TH is in accordance with the second characteristic curve shown in FIG. 9B when the transistor device 1 is in the off-state 112. The information on whether the transistor device 1 is in the on-state or the off-state, is included in the drive signal $S_{DRV}$ received by the threshold generator 71.

Referring to FIG. 11, a comparator 72 receives the threshold signal $S_{TH}$ and the operating parameter signal $S_{OP}$ and outputs a fault detection signal $S_{FD}$. According to one example, the fault detection signal $S_{FD}$ either has a fault level or a normal level. The fault level indicates that by comparing the threshold signal $S_{TH}$ with the operating parameter signal $S_{OP}$ a fault has been detected. The normal level indicates that no fault has been detected. According to one example, a fault is detected and the fault detection signal $S_{FD}$ changes to the fault level when the operating parameter signal $S_{OP}$ rises to above the threshold signal $S_{TH}$.

The operating mode controller 73 outputs an operating mode signal S7 that indicates whether the drive circuit 2 is in the normal mode or the fault mode. A logic gate 79 receives the operating mode signal S7 and the drive signal $S_{DRV}$ and outputs the control signal S5 based on the drive signal $S_{DRV}$ and the operating mode signal S7. The logic gate 79 may generate the control signal S5 such that the control signal S5 equals the drive signal $S_{DRV}$ when the operating mode signal S7 indicates that the drive circuit 2 operates in the normal mode. When the operating mode signal S7 indicates that the drive circuit 2 operates in the fault mode, the logic gate 79 generates the control signal S5, independent of the drive signal $S_{DRV}$, such that the control signal S5 has an off-level that causes the driver 6 (see FIG. 10) to switch off the transistor device 1. According to one example, an on-level of the drive signal $S_{DRV}$ is a high signal level and a high signal level of the operating mode signal S7 represents the normal mode. In this example, the logic gate 79 may be implemented as an AND gate.

According to one example, the threshold generator 71 includes a look-up table in which different values of the threshold signal $S_{TH}$ are stored. Each of these values is associated with a signal level of a drive signal $S_{DRV}$ and a voltage level of the output voltage $V_{DS}$. The threshold generator 71 in this case, at each time, outputs that value that is associated with the signal level of the drive signal $S_{DRV}$ and the voltage level of the load path voltage $V_{DS}$ currently received by the threshold generator. The voltage level of the load path voltage $V_{DS}$ is represented by the load path voltage signal $S_{VDS}$.

Figure 12:
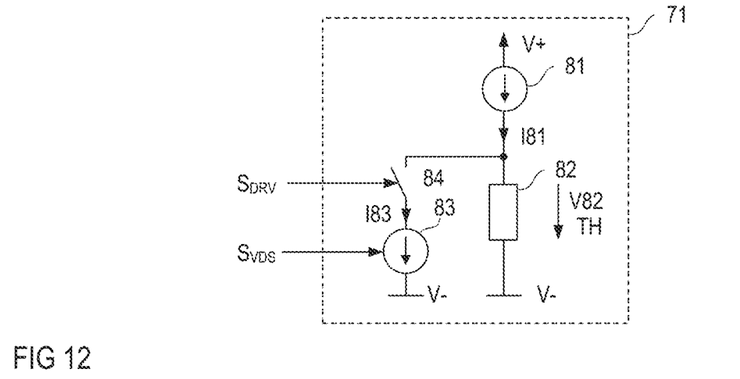
FIG. 12 shows one example of a threshold generator that may be used in the control circuit.

Another example of the threshold generator 71 is shown in FIG. 12. In this example, the threshold TH is represented by a voltage V82 across a resistor 82 connected in series with a first current source 81. The first current source 81 is a constant current source and provides a constant output current I81. A second current source 83 is connected in series with an electronic switch 84, wherein a series circuit with the second current source 83 and the electronic switch 84 is connected in parallel with the resistor 82. The electronic switch 84 is controlled by the drive signal $S_{DRV}$ wherein the electronic switch 84 switches on when the drive signal $S_{DRV}$ has an on-level and switches off when the drive signal $S_{DRV}$ has an off-level so that the electronic switch 84 is switched on when the transistor device 1 is in the on-state in and switched off when the transistor device 1 is in the off-state. When the electronic switch 84 is switched off, the voltage V82 across the resistor 82 is constant and given by a resistance R82 of the resistor 82 multiplied with a current I81 provided by the current source 81. In this case, the threshold is independent of the load path voltage $V_{DS}$ and in accordance with a characteristic curve of the type shown in FIG. 9B.

The second current source 83 is a voltage controlled current source that receives the load path voltage signal $S_{VDS}$. According to one example, this current source 83 is such that a current I83 provided by this current source 83 increases as the load path voltage $V_{DS}$ increases between the first and second levels $V_{DS1}$, $V_{DS2}$. This current source 83 reduces the current through the resistor 82 when the drive signal $S_{DRV}$ switches on the electronic switch 84. Thus, in the on-state of the transistor device 1 the threshold TH is dependent on the load path voltage $V_{DS}$ and in accordance with a characteristic curve of the type shown in FIG. 9A.

Figure 13:
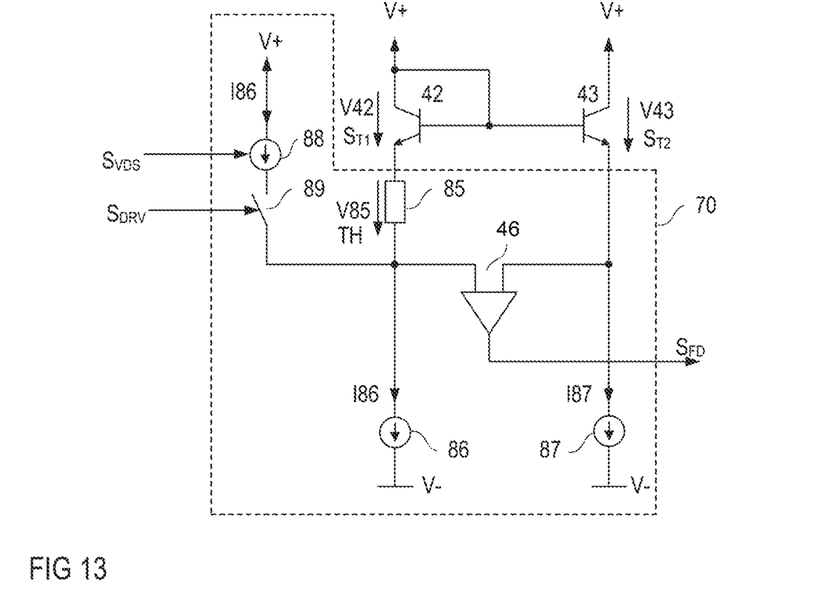
FIG. 13 shows one example of a threshold generator and comparator circuit that may be used in the control circuit.

FIG. 13 shows one example of a circuit that combines the threshold generator 71 and the comparator 72 shown in FIG. 11 and outputs the fault detection signal $S_{FD}$. The circuit 70 is configured to generate the fault detection signal $S_{FD}$ based on an operating parameter that represents a temperature difference as explained with reference to FIG. 7, wherein the circuit 70, instead of an operating parameter signal representing the temperature difference, receives the two signal $ST_1$, $ST_2$ representing the temperature. The temperature sensors 42, 43 are also shown in FIG. 13.

In this example, each of the first and second temperature sensors 42, 43 is a bipolar transistor connected as diode by having the respective collector node C connected to the base node B. Alternatively to connecting the bipolar transistors as diodes their base nodes may be connected to a predefined potential different from the potential at the collector nodes C Further, these bipolar transistors 42, 43 have their base nodes B connected. A first current source 86 is connected in series with the first bipolar transistor 42, and a second current source 87 is connected in series with the second bipolar transistor 43. Voltages V42, V43 between collector and emitter nodes C, E of these bipolar transistors 42, 43 represent the first and second temperatures, so that these voltages V42, V43 can be considered as the first and second temperature signals $ST_1$, $ST_2$. A comparator 46 compares the electrical potential at the emitter node of the second bipolar transistor 43 with the electrical potential at a first node of a resistor 85. The resistor 85 is connected in series with the first bipolar transistor 42, and the first node of the resistor 85 is a node facing away from the first bipolar transistor 42. An output signal of the comparator 46 is the fault detection signal $S_{FD}$. In the circuit 70 shown in FIG. 13, a voltage V85 across the resistor 85 represents the threshold. According to one example, currents I86, I87 provided by the first and second current sources 86, 87 are equal. In this case, the voltages V42, V43 are equal when the temperatures at the position of the first bipolar transistor 42 and the position of the second bipolar transistor 43 are equal. When the temperature at the position of the first bipolar transistor 42 is higher than at the position of the second bipolar transistor 43, the voltage V42 across the first transistor 42 is lower than the voltage V43 across the transistor 43. The comparator 46 is implemented such that the fault detection signal $S_{FD}$ changes to the fault level when the voltage V42 across the first bipolar transistor 42 plus the voltage V85 across the resistor 85 fall below the voltage V43 across the bipolar transistor 43. This indicates that a difference between the temperatures at the first and second positions has crossed the threshold.

Referring to FIG. 13, the circuit 70 includes a further current source 88 that is connected in series with an electronic switch 89. The further current source 88 is a voltage controlled current source and generates an output current I88 dependent on the load path voltage signal $S_{VDS}$. The electronic switch 89 is driven by the drive signal $S_{DRV}$. The current source 88 is activated (by switching on the electronic switch 89) only when the drive signal $S_{DRV}$ has an on-level, that is, when the transistor device 1 is in the on-state. When the current source 88 is activated, it causes that the current through the first bipolar transistor 42 and the resistor 85 is reduced. This, in turn, is equivalent to reducing the temperature difference at which a fault is detected, which is equivalent to reducing the threshold TH.

Figure 14:
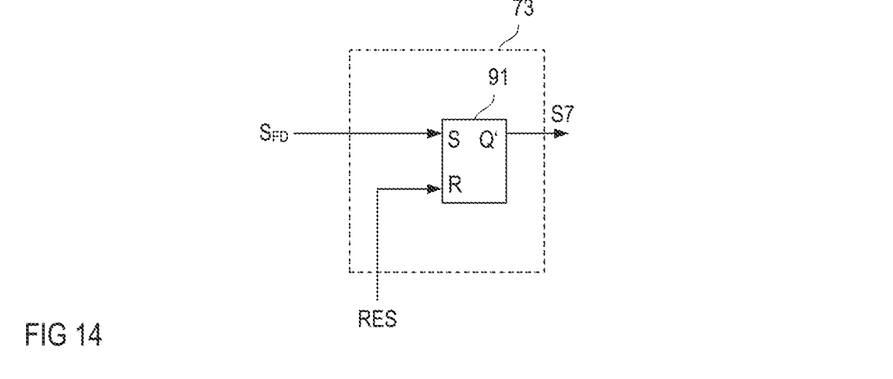
FIG. 14 shows one example of a mode controller in the control circuit.

FIG. 14 shows one example of the mode controller 73. In this example, the mode controller 73 includes a latch such as, for example, an SR-flip-flop. This latch 91 is set when the fault detection signal $S_{FD}$ has a fault level. The latch 91 outputs the operating mode signal S7. According to one example, the operating mode signal S7 is output at an inverting output of the latch 91.

In the operating mode controller 73 shown in FIG. 14, the operating mode signal S7 may change its signal level from the fault level back to the normal level only when the latch 91 is reset. Resetting the latch 91 may include receiving a reset signal RES by the latch 91. This reset signal RES may be generated in various ways dependent on criteria that have to be met in order to reset the operating mode of the drive circuit 2 from the fault mode back to the normal mode. According to one example, the latch 91 is reset each time the drive circuit 2 is reset by interrupting the supply voltage $V_{SUP}$. Alternatively, the latch 91 may be reset after a waiting time as explained above and/or after the operating parameter has fallen below a normal mode threshold.

Figure 15:
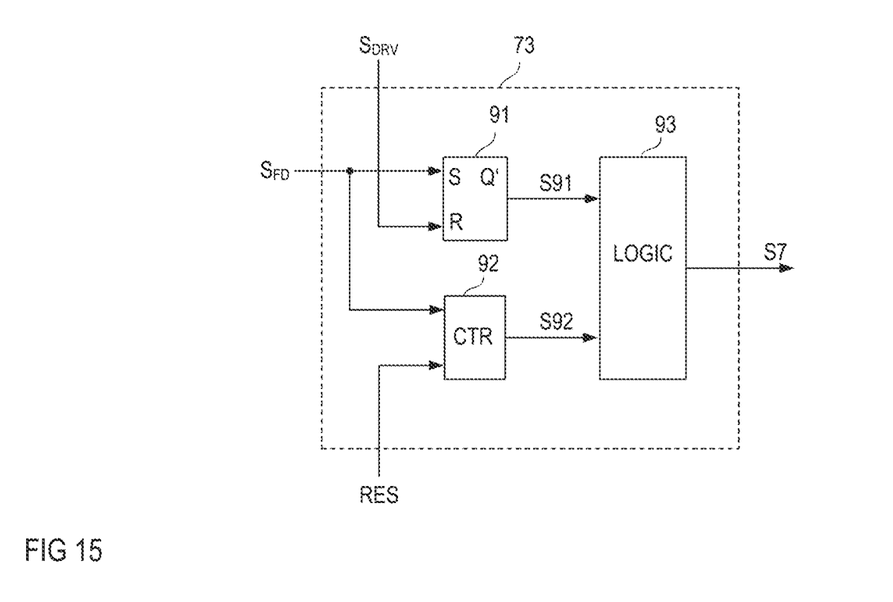
FIG. 15 shows another example of a mode controller in the control circuit.

FIG. 15 shows another example of the operating mode controller 73. In this example, the latch 91 explained with reference to FIG. 14 is reset by the drive signal $S_{DRV}$. According to one example, the latch 91 is reset each time the drive signal $S_{DPV}$ changes from the off-level to the on-level. The operating mode controller 73 further includes a counter 92. This counter 92 counts fault detections. That is, the counter 92 counts how often the fault detection signal $S_{FD}$ changes to the fault level. Further, the counter 92 compares a fault number obtained by counting the fault detections with a threshold and outputs a signal S92 that indicates whether or not the fault number has reached the predefined number. The output signal S92 of the counter 92 and an output signal S91 of the latch 91 are received by a logic gate 93. The logic gate 93 generates the operating mode signal S7 based on the output signal S91, S92 of the latch 91 and the counter 92. The logic gate 93 generates the operating mode signal S7 such that the operating mode signal S7 equals the output signal S91 of the latch when the output signal S92 of the counter 92 indicates that the maximum fault number has not been reached. The output signal S91 of the latch 91 has a fault level when the fault signal $S_{FD}$ indicates that a fault has been detected, wherein the signal level of the latch output signal S91 returns to the normal level when the drive signal $S_{DRV}$ resets the latch 91 when the signal level of the drive signal $D_{RV}$ changes from the off-level to the on-level the next time.

When fault number reaches the predefined number the output signal S92 of the counter 92 changes to a signal level that indicates that the maximum fault number has been reached. This signal causes the logic gate 93 to change the signal level of the operating mode signal S7 to the fault level until the counter is reset and starts counting the fault detections anew. The counter 92 may be reset by a reset signal RES, which may be generated in the same way as the reset signal RES explained with reference to FIG. 14.

Figure 16:
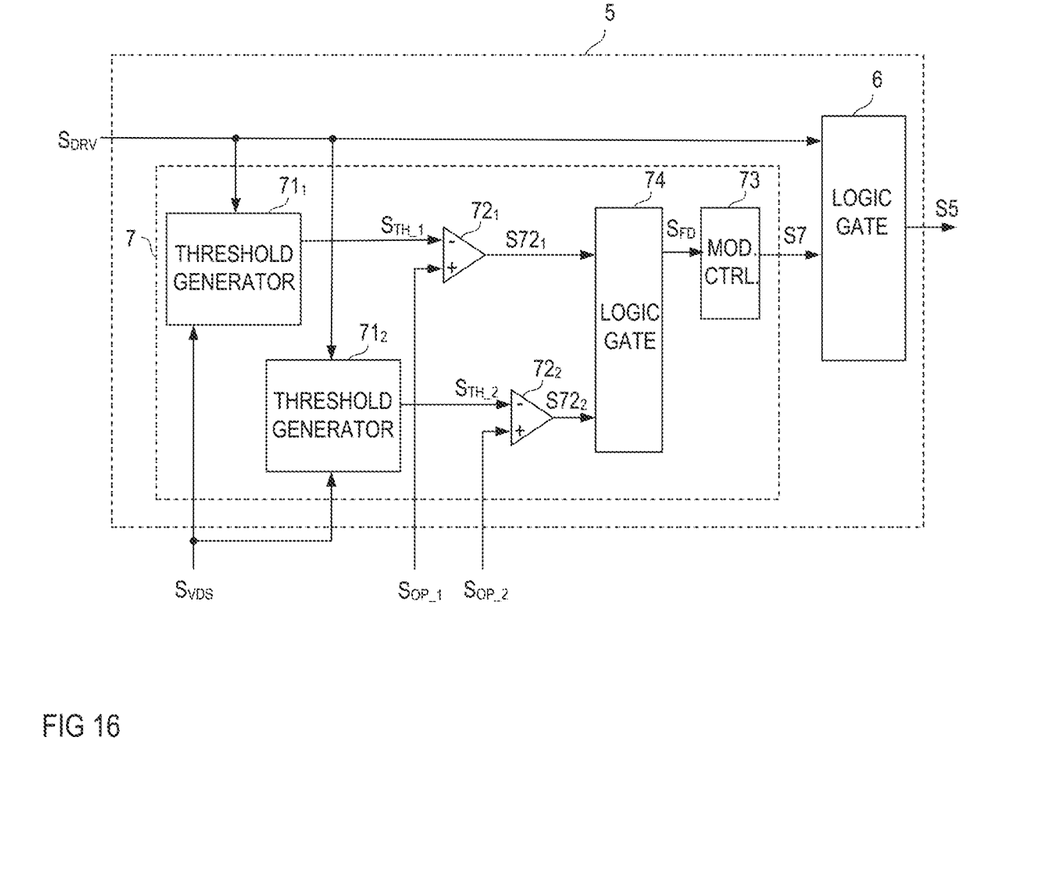
FIG. 16 shows one example of a control circuit configured to monitor more than one operating parameter.

FIG. 16 shows a control circuit 5 according to another example. This control circuit 5 is a modification of the control circuit 5 shown in FIG. 11. The control circuit 5 shown in FIG. 16 is configured to generate the operating mode signal S7 based on more than one operating parameter. For this, the control circuit 5 includes a first threshold generator 711 and a second threshold generator 712. Each of these threshold generators receives the drive signal $S_{DRV}$ and the load path voltage signal $S_{VDS}$. Further, the control circuit 5 includes two comparators, a first comparator 721 that receives a first threshold signal $S_{TH\_1}$ from the first threshold generator 711 and a first operating parameter signal $S_{OP\_1}$, and a second comparator 722 that receives a second threshold signal $S_{TH\_2}$ from the second threshold generator 712 and a second operating mode signal $S_{OP\_2}$. The first threshold signal $S_{TH\_1}$ is generated by the first threshold generator 711 based on first and second characteristic curves associated with a first operating parameter represented by the first operating parameter signal $S_{OP\_1}$, and the second threshold signal $S_{TH\_2}$ is generated by the second threshold generator 712 based on first and second characteristic curves associated with a second operating parameter represented by the second operating parameter signal $S_{OP\_2}$.

Referring to FIG. 16, a logic gate 74 receives a first comparator signal S721 from the first comparator 721 and a second comparator signal S722 from the second comparator 722. The first comparator signal S721 indicates whether the first operating parameter signal $S_{OP\_1}$ is higher or lower than the first threshold $S_{TH\_1}$ and the second comparator signal S722 indicates whether the second operating parameter signal $S_{OP\_2}$ is lower or higher than the second threshold signal $S_{TH\_2}$. The logic gate 74 generates the fault detection signal $S_{FD}$ such that the fault detection signal $S_{FD}$ has a fault level when at least one of the first and second comparators 721, 722 indicates that the respective operating parameter signal $S_{OP\_1}$, $S_{OP\_2}$ has crossed the associated threshold signal $S_{TH\_1}$, $S_{TH\_2}$. According to one example, one of the threshold generators 711, 712 and the associated comparator 721, 722 can be replaced by a circuit 70 of the type shown in FIG. 13.

What is claimed is:

1. A method, comprising:
   monitoring a load path voltage across a load path of a transistor device and an operating parameter of the transistor device;
   operating the transistor device in a normal mode when the operating parameter is below a threshold associated with the operating parameter, wherein operating the transistor device in the normal mode comprises operating the transistor device in one of an on-state or an off-state based on a drive signal; and
   operating the transistor device in a fault mode upon detecting a fault based on comparing the operating parameter with the threshold, wherein operating the transistor device in the fault mode comprises switching off the transistor device,
   wherein operating the transistor device in the on-state comprises adjusting the threshold in accordance with a first characteristic curve that is dependent on the load path voltage, and
   wherein operating the transistor device in the off-state comprises adjusting the threshold in accordance with a second characteristic curve different from the first characteristic curve,
   wherein the operating parameter comprises a plurality of operating parameters,
   wherein detecting the fault comprises detecting the fault based on comparing each of the plurality of operating parameters with a respective one of a plurality of thresholds, and
   wherein each of the plurality of thresholds is obtained, in the on-state of the transistor device, based on a respective one of a plurality of first characteristic curves and, in the off-state of the transistor device, based on a respective one of a plurality of second characteristic curves.

2. The method of claim 1, wherein the threshold according to the first characteristic curve is dependent on the load path voltage.

3. The method of claim 1, wherein the operating parameter is selected from the group consisting of:
   a current through the load path of the transistor device;
   a temperature of the transistor device; and
   a temperature difference between temperatures at different position of the transistor device.

4. The method of claim 1, further comprising:
   upon operating the transistor device in the fault mode, maintaining the transistor device switched off independent of the drive signal.

5. The method of claim 1, further comprising:
   counting detections of the fault in order to obtain a fault number;
   comparing the fault number with a fault threshold; and
   upon operating the transistor device in the fault mode, maintaining the transistor device switched off when the fault number equals the fault threshold, and changing an operating mode from the fault mode to the normal mode when the fault number is below the fault threshold.

6. A method, comprising:
   monitoring a load path voltage across a load path of a transistor device and an operating parameter of the transistor device;
   operating the transistor device in a normal mode when the operating parameter is below a threshold associated with the operating parameter, wherein operating the transistor device in the normal mode comprises operating the transistor device in one of an on-state or an off-state based on a drive signal; and
   operating the transistor device in a fault mode upon detecting a fault based on comparing the operating parameter with the threshold, wherein operating the transistor device in the fault mode comprises switching off the transistor device,
   wherein operating the transistor device in the on-state comprises adjusting the threshold in accordance with a first characteristic curve that is dependent on the load path voltage, and
   wherein operating the transistor device in the off-state comprises adjusting the threshold in accordance with a second characteristic curve different from the first characteristic curve, wherein adjusting the threshold in accordance with the second characteristic curve comprises maintaining the threshold constant as the load path voltage increases within a predefined voltage range.

7. The method of claim 6, wherein adjusting the threshold in accordance with the first characteristic curve comprises decreasing the threshold as the load path voltage increases within the predefined voltage range.

8. The method of claim 7, wherein adjusting the threshold in accordance with the second characteristic curve comprises adjusting the threshold dependent on a load current of the transistor device.

9. The method of claim 8, wherein the threshold increases as the load current increases.

10. A method, comprising:
    monitoring a load path voltage across a load path of a transistor device and an operating parameter of the transistor device;
    operating the transistor device in a normal mode when the operating parameter is below a threshold associated with the operating parameter, wherein operating the transistor device in the normal mode comprises operating the transistor device in one of an on-state or an off-state based on a drive signal;
    operating the transistor device in a fault mode upon detecting a fault based on comparing the operating parameter with the threshold, wherein operating the transistor device in the fault mode comprises switching off the transistor device,
    wherein operating the transistor device in the on-state comprises adjusting the threshold in accordance with a first characteristic curve that is dependent on the load path voltage, and
    wherein operating the transistor device in the off-state comprises adjusting the threshold in accordance with a second characteristic curve different from the first characteristic curve:

counting detections of the fault in order to obtain a fault number;

comparing the fault number with a fault threshold;

upon operating the transistor device in the fault mode, maintaining the transistor device switched off when the fault number equals the fault threshold, and changing an operating mode from the fault mode to the normal mode when the fault number is below the fault threshold,
 wherein operating the transistor device in the normal mode or the fault mode comprises operating the transistor device in the normal mode or the fault mode using a drive circuit; and upon detecting that the fault number equals the fault threshold, changing the operating mode of the transistor device from the fault mode to the normal mode after resetting the drive circuit.

11. The method of claim 10,
 wherein the operating parameter comprises a plurality of operating parameters,
 wherein detecting the fault comprises detecting the fault based on comparing each of the plurality of operating parameters with a respective one of a plurality of thresholds, and
 wherein each of the plurality of thresholds is obtained, in the on-state of the transistor device, based on a respective one of a plurality of first characteristic curves and, in the off-state of the transistor device, based on a respective one of a plurality of second characteristic curves.

12. An electronic circuit, comprising:
 a drive circuit configured to:
  monitor a load path voltage across a load path of a transistor device, and an operating parameter of the transistor device;
  operate the transistor device in a normal mode when the operating parameter is below a threshold associated with the operating parameter, wherein operating the transistor device in the normal mode comprises operating the transistor device in one of an on-state or an off-state based on a drive signal;
  operate the transistor device in a fault mode upon detecting a fault based on comparing the operating parameter with the threshold associated with the operating parameter, wherein operating the transistor device in the fault mode comprises switching off the transistor device;
  in the on-state of the transistor device, adjust the threshold in accordance with a first characteristic curve that is dependent on the load path voltage; and
  in the off-state of the transistor device, adjust the threshold in accordance with a second characteristic curve different from the first characteristic curve,
  wherein the drive circuit is further configured to monitor the operating parameter and detect the fault by:
   monitoring a plurality of operating parameters,
   detecting the fault based on comparing each of the plurality of operating parameters with a respective one of a plurality of thresholds,
   obtaining, in the on-state of the transistor device, each of the plurality of thresholds based on a respective one of a plurality of first characteristic curves, and
   obtaining, in the off-state of the transistor device, each of the plurality of thresholds based on a respective one of a plurality of second characteristic curves.

13. The electronic circuit of claim 12,
 wherein the first characteristic curve is such that the threshold is dependent on the load path voltage, and
 wherein the second characteristic curve is such that the threshold is independent of the load path voltage.

14. The electronic circuit of claim 12, wherein the operating parameter is selected from the group consisting of:
 a current through the load path of the transistor device;
 a temperature of the transistor device; and
 a temperature difference between temperatures at different positions of the transistor device.

15. The electronic circuit of claim 12, wherein the drive circuit is further configured, upon operating the transistor device in the fault mode, to maintain the transistor device switched off independent of the drive signal.

16. The electronic circuit of claim 12, wherein the drive circuit is further configured to
 count detections of the fault in order to obtain a fault number;
 compare the fault number with a fault threshold; and
 upon operating the transistor device in the fault mode, to maintain the transistor device switched off when the fault number equals the fault threshold and to change the operating mode of the transistor device from the fault mode to the normal mode when the fault number is below the fault threshold.

17. The electronic circuit of claim 12, further comprising the transistor device.

18. The electronic circuit of claim 17, wherein the transistor device comprises a MOSFET.

19. An electronic circuit, comprising:
 a drive circuit configured to:
  monitor a load path voltage across a load path of a transistor device and an operating parameter of the transistor device;
  operate the transistor device in a normal mode when the operating parameter is below a threshold associated with the operating parameter, wherein operating the transistor device in the normal mode comprises operating the transistor device in one of an on-state or an off-state based on a drive signal;
  operate the transistor device in a fault mode upon detecting a fault based on comparing the operating parameter with the threshold associated with the operating parameter, wherein operating the transistor device in the fault mode comprises switching off the transistor device;
  in the on-state of the transistor device, adjust the threshold in accordance with a first characteristic curve that is dependent on the load path voltage; and
  in the off-state of the transistor device, adjust the threshold in accordance with a second characteristic curve different from the first characteristic curve,
  wherein the second characteristic curve is such that the threshold is constant as the load path voltage increases within a predefined voltage range.

20. The electronic circuit of claim 19, wherein the first characteristic curve is such that the threshold decreases as the load path voltage increases within the predefined voltage range.

21. An electronic circuit, comprising:
 a drive circuit configured to:

monitor a load path voltage across a load path of a transistor device and an operating parameter of the transistor device;

operate the transistor device in a normal mode when the operating parameter is below a threshold associated with the operating parameter, wherein operating the transistor device in the normal mode comprises operating the transistor device in one of an on-state or an off-state based on a drive signal;

operate the transistor device in a fault mode upon detecting a fault based on comparing the operating parameter with the threshold associated with the operating parameter, wherein operating the transistor device in the fault mode comprises switching off the transistor device;

in the on-state of the transistor device, adjust the threshold in accordance with a first characteristic curve that is dependent on the load path voltage;

in the off-state of the transistor device, adjust the threshold in accordance with a second characteristic curve different from the first characteristic curve;

count detections of the fault in order to obtain a fault number;

compare the fault number with a fault threshold;

upon operating the transistor device in the fault mode, to maintain the transistor device switched off when the fault number equals the fault threshold and to change the operating mode of the transistor device from the fault mode to the normal mode when the fault number is below the fault threshold;

wherein the drive circuit is configured to be reset; and wherein the drive circuit is further configured, upon detecting that the fault number equals the fault threshold, to change the operating mode of the transistor device from the fault mode to the normal mode after the drive circuit is reset.

22. The electronic circuit of claim 21, wherein the drive circuit is further configured to monitor the operating parameter and detect the fault by:
  monitoring a plurality of operating parameters,
  detecting the fault based on comparing each of the plurality of operating parameters with a respective one of a plurality of thresholds,
  obtaining, in the on-state of the transistor device, each of the plurality of thresholds based on a respective one of a plurality of first characteristic curves, and
  obtaining, in the off-state of the transistor device, each of the plurality of thresholds based on a respective one of a plurality of second characteristic curves.

* * * * *